(12) United States Patent
Ogawa et al.

(10) Patent No.: US 10,068,934 B2
(45) Date of Patent: Sep. 4, 2018

(54) ELECTROMAGNETIC WAVE DETECTOR AND ELECTROMAGNETIC WAVE DETECTOR ARRAY

(71) Applicant: Mitsubishi Electric Corporation, Chiyoda-ku (JP)

(72) Inventors: Shimpei Ogawa, Chiyoda-ku (JP); Daisuke Fujisawa, Chiyoda-ku (JP); Masaaki Shimatani, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/540,174

(22) PCT Filed: Jan. 4, 2016

(86) PCT No.: PCT/JP2016/050026
§ 371 (c)(1),
(2) Date: Jun. 27, 2017

(87) PCT Pub. No.: WO2016/121408
PCT Pub. Date: Aug. 4, 2016

(65) Prior Publication Data
US 2018/0006067 A1   Jan. 4, 2018

(30) Foreign Application Priority Data
Jan. 28, 2015 (JP) ................ 2015-014183

(51) Int. Cl.
*H01L 27/14* (2006.01)
*H01L 27/144* (2006.01)
(Continued)

(52) U.S. Cl.
CPC ........ *H01L 27/1446* (2013.01); *H01L 31/028* (2013.01); *H01L 31/102* (2013.01)

(58) Field of Classification Search
CPC .. H01L 27/1446; H01L 31/028; H01L 31/102
See application file for complete search history.

(56) References Cited

U.S. PATENT DOCUMENTS

2011/0042650 A1 * 2/2011 Avouris ............ H01L 29/1606
257/29
2012/0227787 A1   9/2012 Drori et al.
(Continued)

FOREIGN PATENT DOCUMENTS

JP   2012-19132 A   1/2012
JP   2013-502735 A   1/2013
(Continued)

OTHER PUBLICATIONS

International Preliminary Report on Patentability and Written Opinion dated Aug. 10, 2017 in PCT/JP2016/050026 (submitting English translation only).

(Continued)

Primary Examiner — Allan R Wilson
(74) Attorney, Agent, or Firm — Oblon, McClelland, Maier & Neustadt, L.L.P.

(57) ABSTRACT

An electromagnetic wave detector includes: a substrate; an insulating layer provided on the substrate; a graphene layer provided on the insulating layer; a pair of electrodes provided on the insulating layer, with the graphene layer being interposed therebetween; and buffer layers interposed between the graphene layer and the electrodes to separate the graphene layer and the electrodes from each other. The electromagnetic wave detector array includes arrayed electromagnetic wave detectors that are the same as or different from each other.

21 Claims, 8 Drawing Sheets

(51) Int. Cl.
*H01L 31/102* (2006.01)
*H01L 31/028* (2006.01)

(56) References Cited

U.S. PATENT DOCUMENTS

| | | |
|---|---|---|
| 2013/0048952 A1 | 2/2013 | Chen et al. |
| 2013/0082241 A1* | 4/2013 | Kub ............... H01L 27/148 257/21 |
| 2013/0099225 A1 | 4/2013 | Nihei et al. |
| 2013/0126700 A1* | 5/2013 | Choi ............... B82Y 30/00 250/200 |
| 2014/0239256 A1* | 8/2014 | Kim ............... H01L 21/0262 257/29 |
| 2014/0306180 A1 | 10/2014 | Moriwaki et al. |
| 2014/0319357 A1 | 10/2014 | Ogawa et al. |
| 2015/0318401 A1* | 11/2015 | Duan ............... H01L 29/66742 250/200 |
| 2016/0254398 A1* | 9/2016 | Echtermeyer ......... B82Y 30/00 257/432 |

FOREIGN PATENT DOCUMENTS

| | | |
|---|---|---|
| JP | 2013-537700 A | 10/2013 |
| JP | 2014-220488 A | 11/2014 |
| WO | 2011/023603 A2 | 3/2011 |
| WO | 2011/139236 A1 | 11/2011 |

OTHER PUBLICATIONS

International Search Report dated Mar. 29, 2016, in PCT/JP2016/050026, filed Jan. 4, 2016.

Shimatani et al., "Structural investigation for high-responsively graphene photodetectors", The 62nd JSAP Spring Meeting Koen Yokoshu, vol. 62, Feb. 26, 2015, 1 page.

Japanese Office Action dated Aug. 2, 2016, in Japanese Patent Application No. 2016-532011 (with partial English-language translation).

* cited by examiner

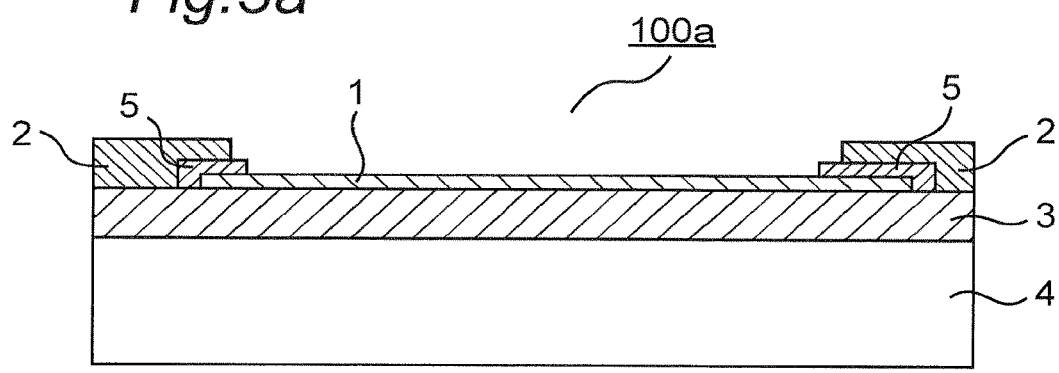
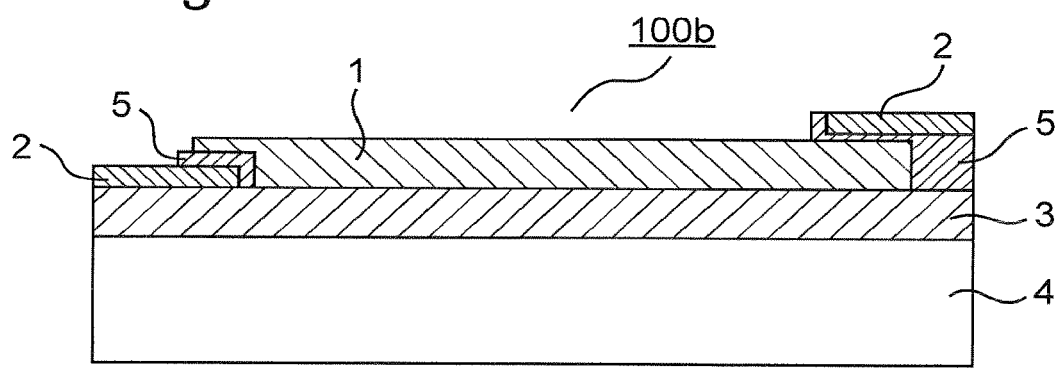
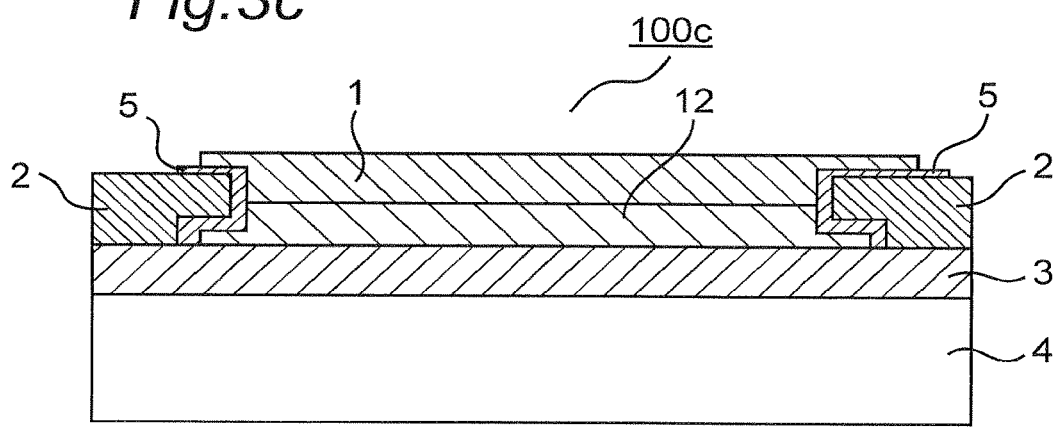

ELECTROMAGNETIC WAVE DETECTOR AND ELECTROMAGNETIC WAVE DETECTOR ARRAY

TECHNICAL FIELD

The present invention relates to an electromagnetic wave detector and an electromagnetic wave detector array which include a detection layer made of graphene, and especially relates to a sensitive electromagnetic wave detector and a sensitive electromagnetic wave detector array which include a buffer layer provided between a detection layer and an electrode.

RELATED ART

In general, a conventional electromagnetic wave detector includes an electromagnetic wave detection layer made of a semiconductor material. Since a semiconductor material has a predetermined band gap, there is a problem that only an electromagnetic wave with energy greater than the band gap can be detected.

Therefore, graphene, which has a zero or a small band gap, draws attraction as a material for a next-generation detection layer. For example, Patent Document 1 proposes an electromagnetic wave detector in which a gate oxide film is provided on a substrate, a graphene channel layer is deposited on the gate oxide film, and a source and a drain are formed on both ends of the channel layer.

PRIOR ART DOCUMENT

Patent Document

Patent Document 1: JP 2013-502735 A

SUMMARY OF THE INVENTION

Problems to be Solved by the Invention

However, electromagnetic-wave absorptivity is as extremely low as several percent if the detection layer is made of only graphene, and there is a problem that detection sensitivity lowers even though a detectable wavelength range is increased.

An object of the present invention is to provide an electromagnetic wave detector which includes a detection layer made of graphene and has a wide range of detection wavelength and high detection sensitivity.

Means for Solving the Problems

The present invention is directed to an electromagnetic wave detector which includes: a substrate; an insulating layer provided on the substrate; a graphene layer provided on the insulating layer; a pair of electrodes provided on the insulating layer, with the graphene layer being interposed therebetween; and buffer layers interposed between the graphene layer and the electrodes so as to separate the graphene layer and the electrodes from each other.

Effects of the Invention

In the present invention, since the buffer layer exists between the detection layer made of graphene and the electrode, movement of electric charges between the graphene and the electrode is hindered, and a Dirac point (DPe) between the graphene and the electrode, other than the Dirac point (DPg) of the graphene itself is formed. Therefore, in a case where detecting light is incident, electric charges move on an electrode surface so as to cancel an incident electric field, more electric charges move between the graphene and the electrode, and DPe disappears. Thus, DPg in the graphene moves, extracted current increases, and detection sensitivity is enhanced.

BRIEF DESCRIPTION OF THE DRAWINGS

FIG. 3A is a cross-sectional view of another electromagnetic wave detector according to the first embodiment of the present invention.

FIG. 3B is a cross-sectional view of another electromagnetic wave detector according to the first embodiment of the present invention.

FIG. 3C is a cross-sectional view of another electromagnetic wave detector according to the first embodiment of the present invention.

EMBODIMENTS OF THE INVENTION

In the embodiments of the present invention, electromagnetic wave detectors will be described using visible light or infrared light. In addition to these types of light, the present invention is effective as a detector for a region of an ultraviolet light, a near-infrared light, a terahertz (THz) wave, a radio wave such as a microwave, or the like. Note that in the embodiments according to the present invention, these lights and radio waves are collectively referred to as electromagnetic waves.

In the embodiments according to the present invention, electromagnetic wave detectors with a structure including two electrodes, that is, a source and a drain, and a back-gate electrode will be described. However, the present invention can be applied to an electromagnetic wave detector with another electrode structure such as a four-terminal electrode structure or a top gate structure.

A surface plasmon resonance phenomenon or a plasmon resonance phenomenon, which is interaction between a metal surface and light, a phenomenon called pseudo surface plasmon which refers to resonance on a metal surface outside a visible-light range and a near-infrared light range, or a phenomenon called a metamaterial or a plasmonic metamaterial which enables manipulation of a specific wavelength due to the structure of the metamaterial or the plasmonic metamaterial with a dimension less than or equal to the specific wavelength are not distinguished from one another by terms but are treated equal from the viewpoint of effects caused by the phenomena. Here, each resonance described above is referred to as surface plasmon resonance or plasmon resonance, or is simply referred to as resonance.

First Embodiment

Figure 1:
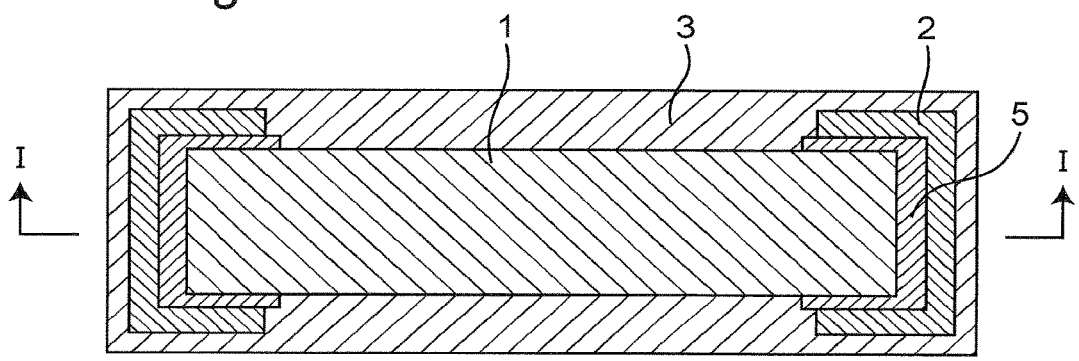
FIG. 1 is a top view of an electromagnetic wave detector according to a first embodiment of the present invention.
Figure 2:
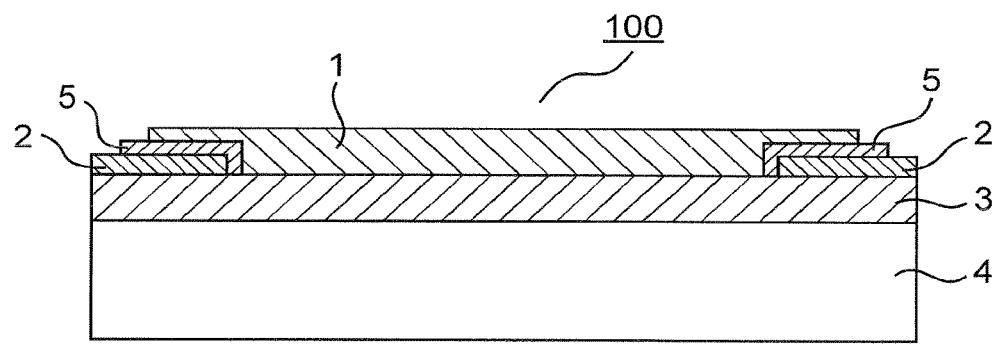
FIG. 2 is a cross-sectional view, taken along I-I direction, of the electromagnetic wave detector shown in FIG. 1.

FIG. 1 is a top view of an electromagnetic wave detector according to a first embodiment of the present invention, the entire of which is denoted by 100. FIG. 2 is a cross-sectional view taken along I-I in FIG. 1.

The electromagnetic wave detector 100 includes a substrate 4 made of, for example, Si. The substrate 4 holds the entirety of the electromagnetic wave detector 100 and is made of, for example, a semiconductor substrate. A high-resistivity silicon substrate, a substrate formed with a thermal oxide film and thus having a high insulating property, or the like is used as the substrate 4. Alternatively, a silicon substrate that is doped in order to form a back gate, which will be described later, may be used. In a case of the substrate with a thermal oxide film, the thermal oxide film may also serve as an insulating layer 3.

The insulating layer 3 made of, for example, silicon oxide ($SiO_2$), silicon nitride (SiN), aluminum oxide, nickel oxide, or boron nitride (BN) is provided on the substrate 4. Since atomic arrangement of boron nitride is similar to atomic arrangement of graphene, boron nitride brought into contact with graphene does not hinder electric charge movement, does not have an adverse effect, and does not deteriorate properties of graphene such as electron mobility. Therefore, boron nitride is preferable as a base film of graphene.

A pair of electrodes 2 is provided on the insulating layer 3. The electrode 2 is made of a metal such as Au, Ag, Cu, Al, Ni, Cr, or Pd. An adhesive film (not shown) made of Cr or Ti may be formed between the electrode 2 and the insulating layer 3 under the electrode 2. The shape of the electrode 2 is not particularly limited as long as the electrode 2 has a size and a thickness enabling the electrode 2 to output an electrical signal.

A buffer layer 5 is provided on the electrode 2. For example, the buffer layer 5 may be made of: an insulator such as silicon oxide ($SiO_2$), aluminum oxide ($Al_2O_3$), or silicon nitride (SiN); an active metal, an alkali metal, or an alkali earth metal such as LiF, $Li_2O_3$, $Li_2CO_3$, Ca, Ba, Cs, $Cs_2CO_3$, or $TiO_2$; a transition metal oxide such as $V_2O_5$, $WO_3$, or $MoO_3$; organic matter; or a mixed film of any of the above metals and organic matter. Alternatively, the buffer layer 5 is acceptable as far as it has an inclusion, such as an OH group, between the electrode 2 and graphene. That is, the material of the buffer layer 5 may be any as long as the material enables the buffer layer 5 to hinder movement of electric charges between graphene and the electrode and to form the Dirac point (DPe) between the graphene and the electrode, other than the Dirac point of the graphene itself.

Note that even though the term "layer" is included in the term "buffer layer 5", there may be variation in density or a discontinuous region in an atomic layer level. Specifically, the buffer layer 5 may be made of nanoparticles.

A graphene layer 1 is provided on the insulating layer 3. The buffer layer 5 is interposed between the graphene layer 1 and the electrode 2. The graphene layer 1 is made of at least one layer of graphene. As the number of laminated layers of graphene is increased, light absorptivity increases and sensitivity of the electromagnetic wave detector 100 is enhanced. Graphene is a monoatomic layer of a two-dimensional carbon crystal. The thickness of single-layer graphene is as extremely thin as 0.34 nm, which is equal to the thickness of one carbon atom. Graphene has carbon atoms in each hexagonal ring.

In a case where the graphene layer 1 has a laminated structure of at least two layers, directions of lattice vectors of hexagonal lattices of any two layers of graphene included in the laminated structure may not match, that is, may be shifted from each other. In addition, the graphene layer 1 has a laminated structure in which lattice vectors of any two layers may completely match. In particular, a wavelength selection effect can be imparted to the graphene layer 1 since a band gap is formed when at least two layers of graphene are laminated.

In addition, in a case where nanoribbon graphene is used, a structure formed of single nanoribbon or a structure where a plurality of nanoribbons is arranged may be adopted. The graphene layer 1 may be non-doped graphene or may be p-type or n-type doped graphene. By doping the graphene layer 1 into n-type or p-type, the location of the Dirac point (DPg) in graphene can be controlled, as described later.

As described, since the electromagnetic wave detector 100 according to the first embodiment of the present invention includes the buffer layer 5 between the graphene layer 1 and the electrode 2, a threshold electric field which changes electric charge mobility of the graphene layer 1 is formed according to presence or absence of electromagnetic wave irradiation. Therefore, by irradiating the graphene layer 1 with light, the Dirac point (DPg) of the graphene layer 1 is shifted. As a result, a great change in current occurs, and the electric resistance value of the graphene layer 1 changes. By detecting the change in the electric resistance value by means of the electrodes 2 arranged outside the graphene layer 1, the intensity of the electromagnetic wave with an arbitrary wavelength can be detected with high sensitivity as an electrical signal.

In addition, an output amplifier circuit made of graphene may be provided together with the electromagnetic wave detector 100. The output amplifier circuit may be provided adjacent to or under the electromagnetic wave detector 100. The operation speed of the output amplifier circuit becomes faster than that of an output amplifier made of a silicon-based semiconductor material, and therefore a high-performance electromagnetic wave detector can be realized.

In addition, a peripheral circuit such as a reading circuit made of graphene enables high-speed reading and simplification of manufacturing processes.

FIGS. 3A to 3F are cross-sectional views of other electromagnetic wave detectors according to the first embodiment of the present invention. In FIGS. 3A to 3F, reference symbols identical to those in FIGS. 1 and 2 denote identical or corresponding portions.

In an electromagnetic wave detector 100a illustrated in FIG. 3A, a graphene layer 1 is formed on an insulating layer 3, and a buffer layer 5 and electrodes 2 are formed on the graphene layer 1 in this order. A method such as vapor deposition which does not damage the graphene layer 1 is preferably used for formation of the buffer layer 5 and the electrodes 2.

In an electromagnetic wave detector 100b illustrated in FIG. 3B, a graphene layer 1 is provided on one electrode 2 (left electrode in FIG. 3B) via a buffer layer 5, and the other electrode 2 (right electrode in FIG. 3B) is provided on the graphene layer 1 via a buffer layer 5.

In an electromagnetic wave detector 100c illustrated in FIG. 3C, two graphene layers 1 and 12 are formed. Electrodes 2 are formed on the graphene layer 12 with buffer layers 5 interposed between the electrodes 2 and the graphene layer 12. In contrast, the graphene layer 1 is formed on the electrodes 2 with the buffer layers 5 interposed between the graphene layer 1 and the electrodes 2.

Figure 3D:
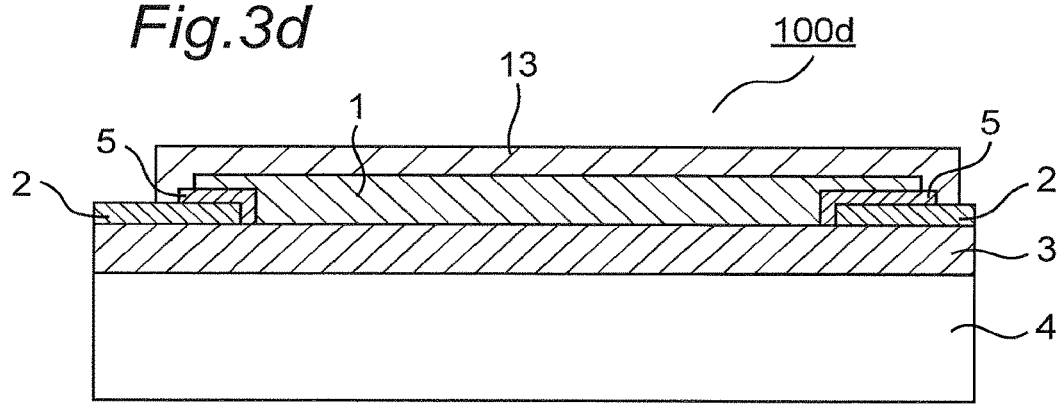
FIG. 3D is a cross-sectional view of another electromagnetic wave detector according to the first embodiment of the present invention.

In an electromagnetic wave detector 100d illustrated in FIG. 3D, a protective film 13 is formed so as to cover a graphene layer 1, buffer layers 5, and electrodes 2. In a case where the buffer layer 5 is made of a thin film such as a natural oxide film, provision of the protective film 13 can prevent a change in the property of the buffer layer 5 due to an influence of an ambient atmosphere. In particular, in a case where the electromagnetic wave detector is used in a high-temperature or low-temperature environment, it is important to keep the graphene layer 1 and the buffer layer 5 in contact with each other. That is, provision of the protective film 13 ensures stable operation. The protective film 13 is formed of an insulating film made of silicon oxide ($SiO_2$), aluminum oxide ($Al_2O_3$), silicon nitride (SiN), or the like.

Figure 3E:
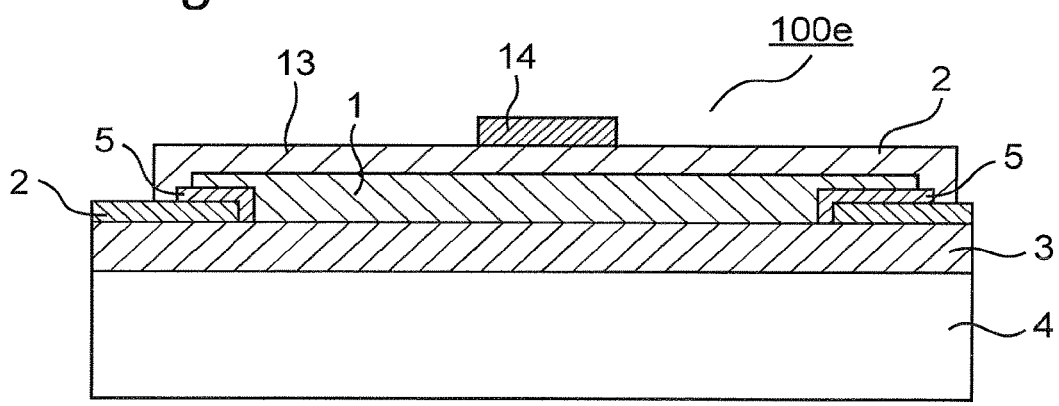
FIG. 3E is a cross-sectional view of another electromagnetic wave detector according to the first embodiment of the present invention.

In an electromagnetic wave detector 100e shown in FIG. 3E, an electrode 14 is provided on a protective film 13. The electrode 14 operates as a top gate electrode. In contrast, a back-gate structure (see FIG. 5) may be adopted where voltage is applied from the back side (lower side in FIG. 3E) of a substrate 4 and an electrical signal applied to electrodes 2 is detected.

Figure 3F:
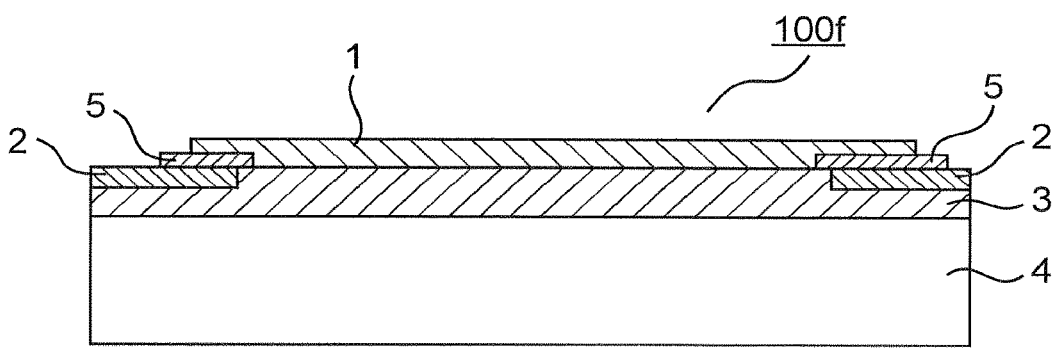
FIG. 3F is a cross-sectional view of another electromagnetic wave detector according to the first embodiment of the present invention.

In an electromagnetic wave detector 100f shown in FIG. 3F, top surfaces of electrodes 2 are flush with a top surface of an insulating layer 3. Buffer layers 5 are interposed between a graphene layer 1 and the electrodes 2.

Next, principles of operation of the electromagnetic wave detector 100 according to the first embodiment of the present invention will be described. In the electromagnetic wave detector 100, the buffer layer 5 made of an oxide film or the like exists between the graphene layer 1 and the electrode 2. In a case where there is no buffer layer 5, the potential of the contact between the graphene layer 1 and the electrode 2 remains the same even if any bias voltage is applied to the graphene layer 1. However, as can be seen from actual measurement results illustrated in FIG. 4, in a case where there is the buffer layer 5, since movement of electric charges between graphene and the electrode is hindered, an energy level is formed due to an influence of the buffer layer 5 between the graphene and the electrode, the energy level differing from the energy level at the Dirac point DP of the graphene itself (hereinafter referred to as "DPg1"). In the present invention, the Dirac point DP formed between the graphene and the electrode is hereinafter referred to as "DPe". DPe can be defined as a point which becomes a threshold electric field for changing electric charge mobility of graphene according to presence or absence of light irradiation. That is, to put it simply, it can be considered that DPe is formed since the buffer layer 5 hinders movement of electric charges between the graphene layer 1 and the electrode 2.

Here, the thickness of the buffer layer 5 may be any as long as electric charges can move between the graphene layer 1 and the electrode 2 via the buffer layer 5 in a case where the graphene layer 1 is irradiated with an electromagnetic wave. If the buffer layer 5 is too thick, electric charges cannot move between the graphene layer 1 and the electrode 2. Therefore, in general, the thickness of the buffer layer 5 is preferably as extremely thin as about thickness of several atomic layers to 10 nm. However, depending on the material of the buffer layer 5, there are cases where electric charges can move even if the thickness of the buffer layer 5 is greater than the above thickness.

Note that if an emitted electromagnetic wave can reach the graphene layer 1, the electrode 2, and the buffer layer 5 between them when the electromagnetic wave is emitted, a protective film or the like may be formed on them.

In general, in a case where light is incident on the electromagnetic wave detector 100, electric charges move on the surface of the electrode 2 so as to cancel an electric field of the incident light. Energy generated at that time causes electric charges to tunnel through the buffer layer 5, and thus more electric charges move between the graphene layer 1 and the electrode 2 and the Dirac point DPe between the graphene and the electrode disappears. An effect other than the effect caused by the electrode is as follows. Electric charges increased as a result of light absorption by graphene are blocked by the buffer layer 5 and are accumulated. Electric charges start to tunnel through the buffer layer 5 when a bias voltage reaches a certain bias voltage serving as a boundary. As a result, electric charge distribution inside the graphene layer 1 of the electromagnetic wave detector 100 changes and DPe disappears. As a result, DPg1 moves to be DPg2. According to the above principle, in a case where the electromagnetic wave detector 100 is irradiated with light, photocurrent increases due to the influence of the buffer layer 5.

Figure 4:
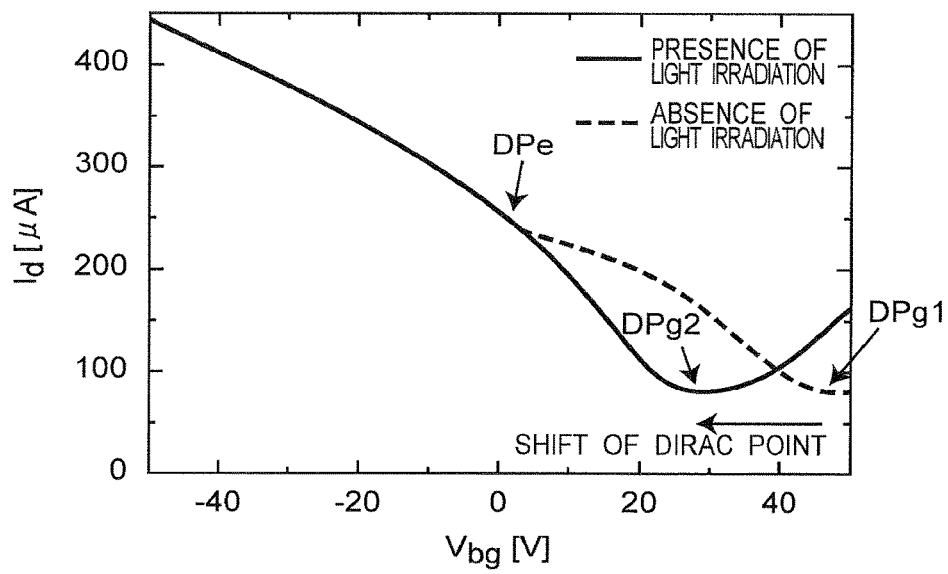
FIG. 4 shows electrical characteristics in a case where the electromagnetic wave detector according to the first embodiment of the present invention is irradiated with light and in a case where the electromagnetic wave detector is not irradiated with light.

FIG. 4 shows measurement results of electrical characteristics of the graphene layer 1 in a case where the electromagnetic wave detector 100 according to the first embodiment is irradiated with light and in a case where the electromagnetic wave detector 100 is not irradiated with light. In FIG. 4, the abscissa axis indicates back-gate voltage, and the axis of ordinate indicates current flowing between the two electrodes 2. The graphene layer 1 is made of a single graphene layer. The distance between the two electrodes 2 is 5 μm, and the length (top-bottom direction in FIG. 1) of the electrode 2 is 15 μm. The electrode 2 has a metal multilayer structure, and the uppermost surface of the electrode 2 is made of gold. The thickness of the electrode 2 is 30 nm. A Ti film with a thickness of 5 nm is formed between the electrode 2 and the insulating layer 3 in order to improve adhesion between them. The substrate 4 is made of N-type doped silicon. The substrate 4 operates as a back gate type where voltage is applied from the back surface of the substrate. The insulating layer 3 is made of a silicon thermal oxide film ($SiO_2$), and has a thickness of 290 nm. The buffer layer 5 is gold oxide film formed by oxidizing gold on the surface of the electrode 2 by UV ozone treatment. The thickness of the buffer layer 5 is less than or equal to several nm. Alternatively, the buffer layer 5 may be an inclusion such as an OH group.

The above dimensions are dimensions of samples used in measurement in FIG. 4. The dimensions of the electromagnetic wave detector 100 are not limited to the above dimensions, and are appropriately designed depending on sensitivity or the like of the electromagnetic wave detector 100. Here, one of the two electrodes 2 is set as a source and the other is set as a drain, and the substrate 4 functions as a back gate by applying voltage from the back surface of the substrate 4 (see FIG. 5).

In FIG. 4, DPg1 and DPe in a case of absence of light irradiation and DPg2 moved due to light irradiation clearly appear. As illustrated in FIG. 4, the difference between DPg1 and DPg2 is as extremely great as about 20 V. As a result of shift of the Dirac point due to light irradiation, the current is 100 μA in a case where back-gate voltage Vbg is for example, about 25 V. The calculation result of sensitivity obtained in the above experiment is about several hundred A/W, which is extremely great. An optical response more sensitive than that of graphene without DPe can be obtained since the current change amount in a case of graphene without DPe is extremely small.

As described above, asymmetry between the Dirac point at the contact point between the graphene layer 1 formed on the electrode 2 and the electrode 2 which includes the buffer layer 5 made of an oxide film on the metal surface and the Dirac point of the graphene itself, and cancellation of the asymmetry due to electric field movement in a metal portion of the electrode 2 upon light irradiation result in an increase in extracted current upon light irradiation. In addition, in the back-gate structure, the silicon substrate is preferably doped. In particular, in a case where DPe is formed in a region where Vbg is a positive voltage, an N-type silicon substrate tends to increase the difference between DPg1 and DPg2. In addition, in a case where DPe is formed in a region where Vbg is a negative voltage, a P-type silicon substrate tends to increase the difference between DPg1 and DPg2. However, there effects occur in combination with effects caused by the buffer layer and the like.

When the detector is in an operated state, the detector may detect photocurrent generated by an electromagnetic wave incident on the graphene layer 1. In that case, the electromagnetic wave detector 100 operates irrespective of application of an external bias between the electrodes 2 located at both ends of a photocurrent generation path of the graphene layer 1. However, application of a bias improves detection efficiency of generated carriers.

An electrical circuit for extracting a change in photocurrent such as an external bias is connected to the graphene layer 1 via the electrode 2. According to an example of the method for reading an electrical signal, when voltage Vd is applied between the two electrodes 2, an electrical signal which is a change in the resistance value in the graphene layer 1 changes a current amount Id flowing between the electrodes 2. By detecting the change in the current amount, the magnitude of the incident electromagnetic wave can be detected. A circuit which makes a fixed current flow between the two electrodes 2 may be provided and a change amount of the voltage value may be detected.

Figure 5:
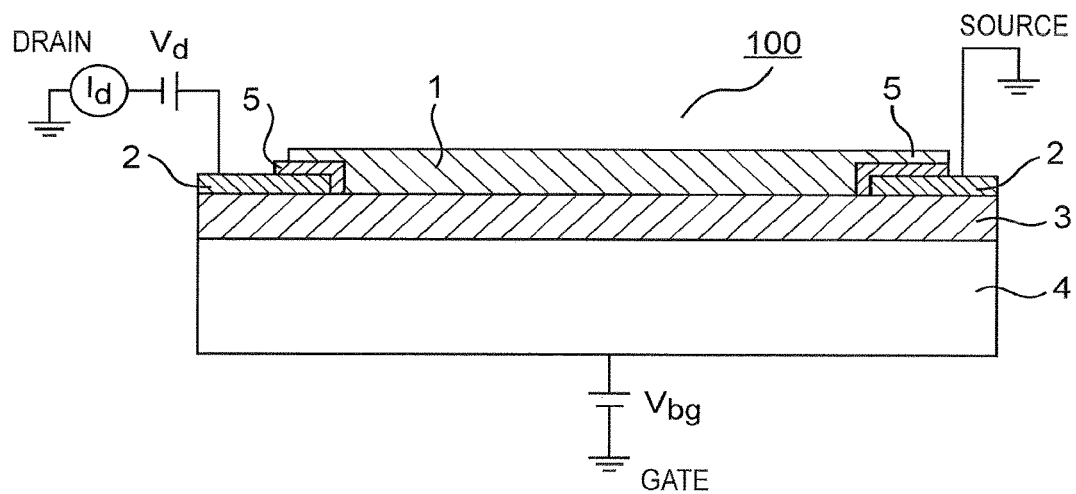
FIG. 5 is a circuit diagram of the electromagnetic wave detector according to the first embodiment of the present invention.

In addition, as shown in FIG. 5, an electrical signal may be extracted by configuring a transistor structure where the back surface of the substrate 4 serves as a back-gate terminal and is used in combination with the electrodes 2 having two terminals. In this case, by applying voltage to the back surface of the substrate 4, a further greater electric field can be generated at the graphene layer 1, and carriers generated by incidence of an electromagnetic wave can be highly efficiently detected.

In addition, only one electrode 2 may be formed, and a change in potential of the graphene layer 1 caused by incidence of an electromagnetic wave may be detected by means of the electrode 2.

In addition, an electrical signal may be extracted by adopting a top gate structure where a transistor structure is formed by forming an oxide film on the graphene layer 1, providing agate terminal on the oxide film, and using the gate terminal in combination with the electrodes 2 having two terminals (see FIG. 3E).

For the sake of simplification, in the first embodiment according to the present invention, a description has been given of a case where a pair of electrodes 2 is formed and electric resistance between the electrodes 2 is detected. However, another structure such as a transistor structure may be adopted.

Next, a method for manufacturing the electromagnetic wave detector 100 will be briefly described. The method for manufacturing the electromagnetic wave detector 100 includes the following steps 1 to 5.

Step 1: First, the flat substrate 4 made of silicon or the like is prepared.

Step 2: The insulating layer 3 is formed on the substrate 4. For example, in a case where the substrate 4 is made of silicon, the insulating layer 3 may be made of silicon oxide ($SiO_2$) formed by thermal oxidation. In addition, another insulating film may be formed by CVD or sputtering.

Step 3: The electrode 2 made of Au, Ag, Cu, Al, Ni, Cr, or the like is formed. At that time, in order to improve adhesion between the electrode 2 and the insulating layer 3 under the electrode 2, an adhesive film made of Cr or Ti may be formed. The electrode 2 is formed as follows. A resist mask is formed by photoengraving, EB drawing, or the like, and then a metal layer made of Au, Ag, Cu, Al, Ni, Cr, or the like is deposited on the resist mask by vapor deposition, sputtering, or the like.

Step 4: The buffer layer 5 is formed by oxidizing the surface of the electrode 2 made of metal. Oxidization of the electrode 2 is performed by UV irradiation in ozone atmosphere (UV ozone processing), plasma irradiation, natural oxidation, or the like. An oxide film may be formed by using a solution or the like. Alternatively, an insulating film made of silicon oxide ($SiO_2$), aluminum oxide ($Al_2O_3$), silicon nitride (SiN), or the like may be formed in a region in contact with the graphene layer 1, on the electrode 2. Furthermore, the buffer layer 5 may be formed of an active metal, an alkali metal, or an alkali earth metal such as LiF, $Li_2O_3$, $Li_2CO_3$, Ca, Ba, Cs, $Cs_2CO_3$, or $TiO_2$, a transition metal oxide such as $V_2O_5$, $WO_3$, or $MoO_3$, organic matter, or a mixed film of any of the above metals and organic matter. That is, a film may be made of any material as long as the material causes the buffer layer 5 to form DPe other than the Dirac point of graphene itself.

Step: 5 Graphene formed on the electrodes 2 and the insulating layer 3. Graphene may be formed by epitaxial growth, or a graphene layer formed by a CVD method in advance may be transferred and stuck onto the electrodes 2 and the insulating layer 3. In addition, graphene peeled by mechanical peeling or the like may be transferred. Subsequently, graphene is coated with a resist mask by photograving or the like, is etched by oxygen plasma and is patterned. Thus, an unnecessary portion of graphene other than a channel portion and a portion in contact with the electrodes 2 is removed, and thus the graphene layer 1 is formed.

Through the above steps 1 to 5, the electromagnetic wave detector 100 according to the first embodiment of the present invention is completed.

Second Embodiment

Figure 6:
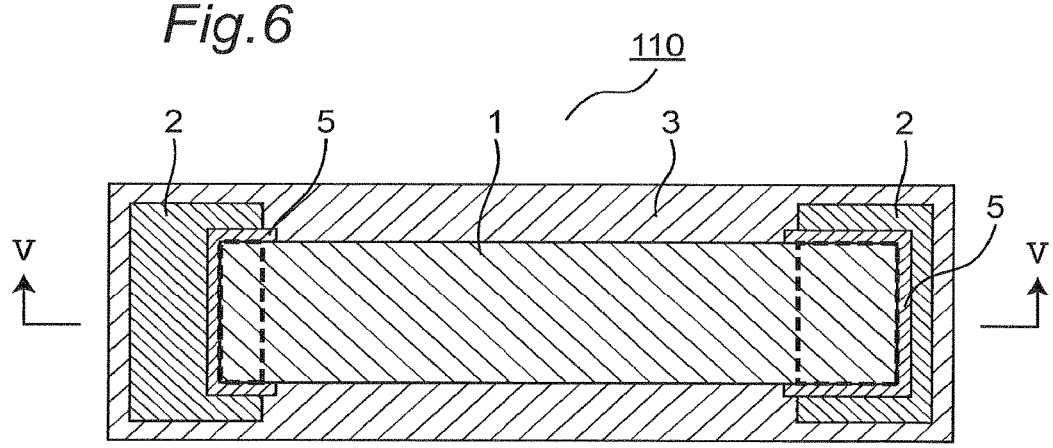
FIG. 6 is a top view of an electromagnetic wave detector according to a second embodiment of the present invention.
Figure 7:
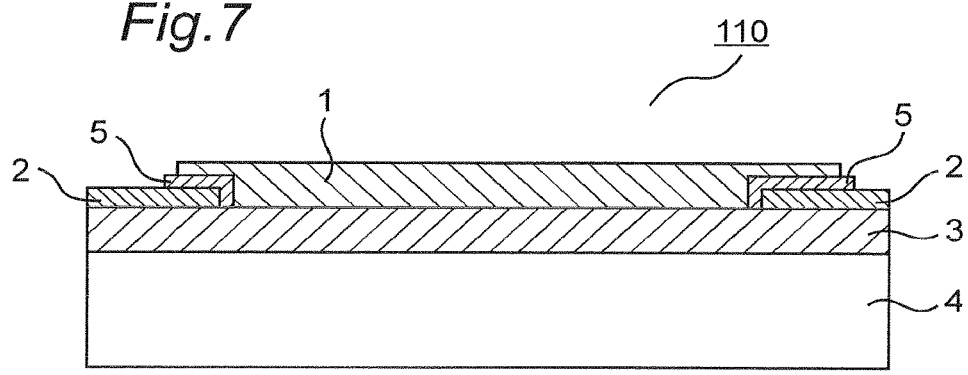
FIG. 7 is a cross-sectional view, along V-V direction, of the electromagnetic wave detector shown in FIG. 6.

FIG. 6 is a top view of an electromagnetic wave detector according to a second embodiment of the present invention, the entirety of which is denoted by 110. FIG. 7 is a cross-sectional view taken along V-V in FIG. 6. In FIGS. 6 and 7, reference symbols identical to those in FIGS. 1 and 2 denote identical or corresponding portions.

The difference between an electromagnetic wave detector 110 according to the second embodiment and the electromagnetic wave detector 100 according to the first embodiment is that, in the electromagnetic wave detector 110, the size of the area where a graphene layer 1 overlaps with an electrode 2 via a buffer layer 5 (shown by a dashed line in FIG. 6) differs between two electrodes 2, that is, a source electrode and a drain electrode. In order to obtain such a structure, graphene is processed such that the size of the area of graphene on a source differs from that on a drain in the step of processing graphene (step 5) in the first embodiment.

If the size of the area where the graphene layer 1 overlaps with the electrode 2 differs between the source electrode and the drain electrode, the amount of electric charges which move from a metal configuring the electrode 2 to the graphene layer 1 differs between the source electrode and the drain electrode accordingly. That is, the energy gap differs between the source electrode and the drain electrode. Therefore, upon light irradiation, a bias is generated between the two electrodes 2 due to generated carriers and photocurrent increases. Alternatively, a Dirac point DPe between graphene and the electrode, other than a Dirac point DP of the graphene itself is formed. Upon light irradiation, a phenomenon identical to the phenomenon in the first embodiment occurs, and a change in photocurrent increases.

As described above, in the electromagnetic wave detector 110 according to the second embodiment, photocurrent can be increased upon light irradiation and sensitivity of the electromagnetic wave detector 110 can be improved.

Third Embodiment

Figure 8:
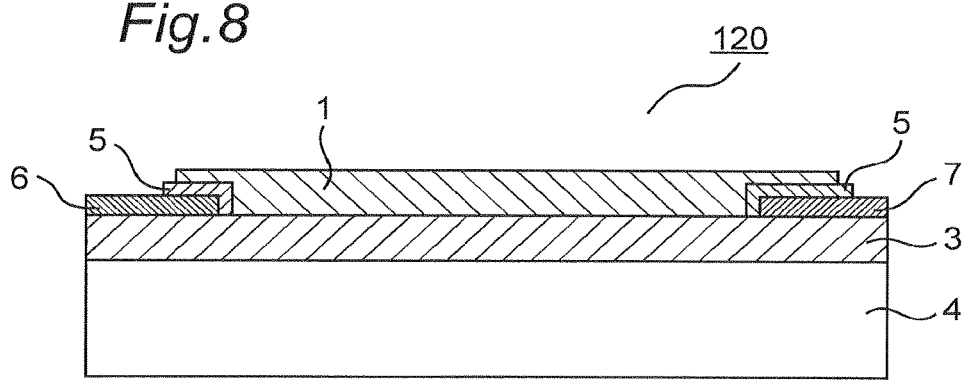
FIG. 8 is a cross-sectional view of an electromagnetic wave detector according to a third embodiment of the present invention.

FIG. 8 is a cross-sectional view of an electromagnetic wave detector according to a third embodiment of the present invention, the entirety of which is denoted by 120. In FIG. 8, reference symbols identical to those in FIGS. 1 and 2 denote identical or corresponding portions.

The difference between an electromagnetic wave detector 120 according to the third embodiment and the electromagnetic wave detector 100 according to the first embodiment is that, in the electromagnetic wave detector 120, an electrode 6 (for example, a source electrode) and an electrode 7 (for example, a drain electrode) are made of different metals. The Fermi level of graphene moves or the contact resistance of graphene changes depending on the kind of a metal brought into contact with graphene. Therefore, in a case where the electrode 6 and the electrode 7 are made of different metals, the energy gap of the source differs from that of the drain. Therefore, in a case where the electromagnetic wave detector 120 is irradiated with light, a bias is generated between the electrodes 6 and 7 due to generated carriers and photocurrent increases, and thus sensitivity of the electromagnetic wave detector 120 can be improved.

Fourth Embodiment

Figure 9:
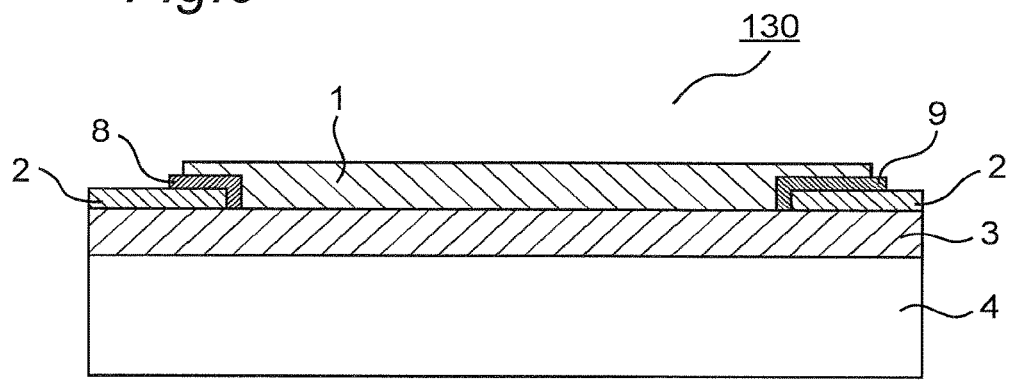
FIG. 9 is a cross-sectional view of an electromagnetic wave detector according to a fourth embodiment of the present invention.

FIG. 9 is a cross-sectional view of an electromagnetic wave detector according to a fourth embodiment of the present invention, the entirety of which is denoted by 130. In FIG. 9, reference symbols identical to those in FIGS. 1 and 2 denote identical or corresponding portions.

The difference between an electromagnetic wave detector 130 according to the fourth embodiment and the electromagnetic wave detector 100 according to the first embodiment is that, in the electromagnetic wave detector 130, buffer layers 8 and 9 formed on two electrodes 2 are made of different oxides. As a result, contact resistance between the electrode and graphene differs between the two electrodes 2, that is, a source electrode and a drain electrode, and the energy gap differs between the source and the drain. Therefore, in a case where the electromagnetic wave detector 130 is irradiated with light, a bias is generated between the two electrodes 2 due to generated carriers and photocurrent increases, and thus sensitivity of the electromagnetic wave detector 130 can be improved.

Fifth Embodiment

Figure 10:
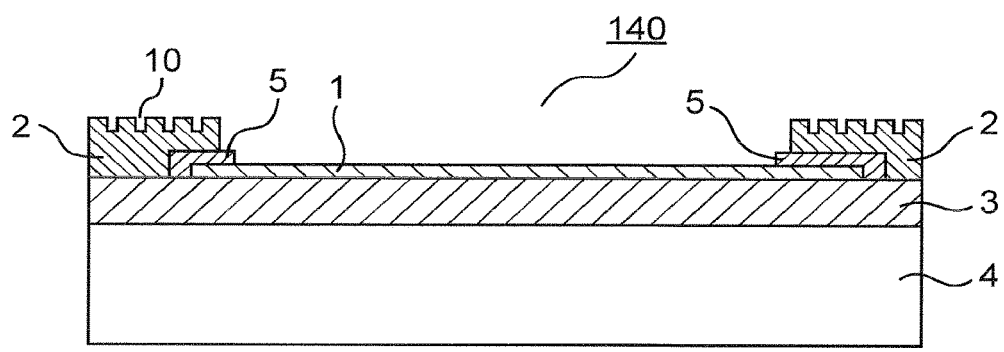
FIG. 10 is a cross-sectional view of an electromagnetic wave detector according to a fifth embodiment of the present invention.

FIG. 10 is a cross-sectional view of an electromagnetic wave detector according to a fifth embodiment of the present invention, the entirety of which is denoted by 140. In FIG. 10, reference symbols identical to those in FIGS. 1 and 2 denote identical or corresponding portions.

Figure 11:
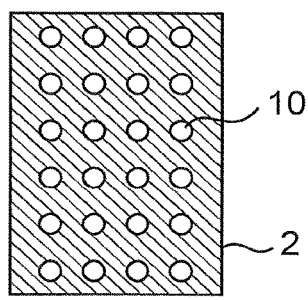
FIG. 11 is a top view of an electrode of the electromagnetic wave detector according to the fifth embodiment of the present invention.
Figure 12:
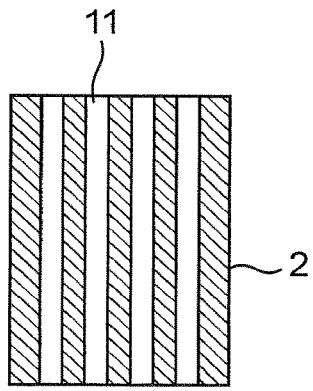
FIG. 12 is a top view of an electrode of the electromagnetic wave detector according to the fifth embodiment of the present invention.

The difference between an electromagnetic wave detector 140 according to the fifth embodiment and the electromagnetic wave detector 100 according to the first embodiment is that, in the electromagnetic wave detector 140, periodic recesses 10 and 11 are formed on surfaces of electrodes 2. FIGS. 11 and 12 are top views of the electrode 2. For example, the recesses are columnar recesses two-dimensionally arranged at predetermined intervals as illustrated in FIG. 11. Arrangement may be any periodic array such as a square lattice or a triangular lattice. In lieu of a columnar shape, the recess may have another shape such as a prism, a triangular prism, a quadrangular prism, or an elliptic cylinder. In addition, for example, recesses 11 may be first-dimensional grooves arranged side by side as illustrated in FIG. 12. Plasmon resonance occurs regardless of whether or not these recesses 10 or 11 penetrate through the electrode 2. A pattern for detecting a target wavelength may be appropriately designed.

Since the periodic recesses 10 or 11 are provided on the surfaces of the electrodes 2, plasmon resonance which is highly localized on a metal surface occurs at a specific wavelength. The electrode 2 may be made of any metal as long as the metal causes surface plasmon resonance. For example, Au, Ag, Al or the like is used.

Here, a case where the periodic recesses 10 or 11 are formed on the surfaces of the electrodes 2 has been described. However, periodic projections may be formed, in which case plasmon resonance having a similar effect occurs.

Here, the resonance wavelength of plasmon resonance is determined depending on a periodic structure. By forming the above-described periodic structure on the electrode 2, only electromagnetic waves with a specific resonance wavelength can be absorbed on the surface of the electrode. That is, the electromagnetic wave detector 140 can intensively detect only electromagnetic waves with a specific resonance wavelength, and detection sensitivity for a specific wavelength can be enhanced.

Sixth Embodiment

Figure 13:
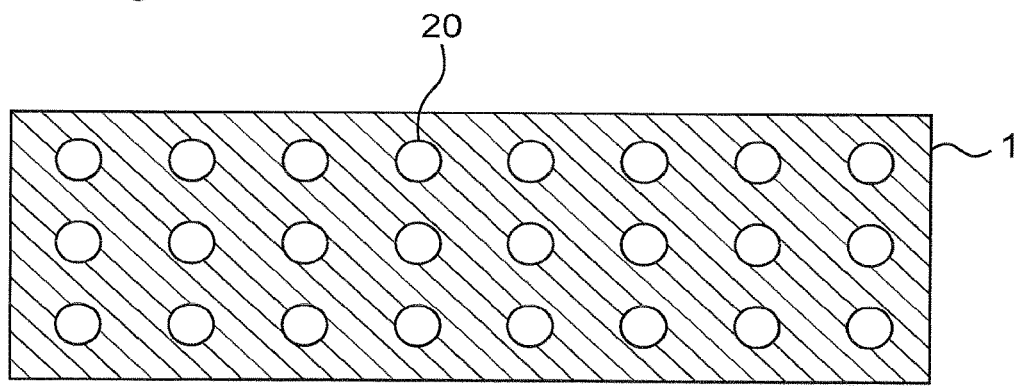
FIG. 13 is a top view of a graphene layer of an electromagnetic wave detector according to a sixth embodiment of the present invention.
Figure 14:
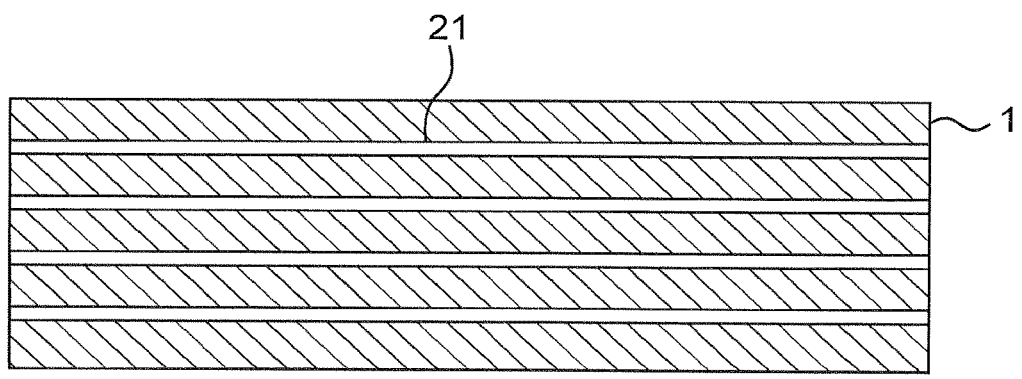
FIG. 14 is a top view of a graphene layer of the electromagnetic wave detector according to the sixth embodiment of the present invention.

FIGS. 13 and 14 are top views each showing only a graphene layer 1 used in an electromagnetic wave detector according to a sixth embodiment of the present invention. The difference from the electromagnetic wave detector 100 according to the first embodiment is that, in the electromagnetic wave detector according to the sixth embodiment, periodic first-dimensional or second dimensional recesses 20 or 21 are formed on the graphene layer 1. The recesses 20 and 21 may be holes which penetrate through the graphene layer 1. In a case where the graphene layer 1 is made of a single layer, the recesses 20 and 21 are holes which penetrate through the graphene layer 1. In a case where the graphene layer 1 is made of a plurality of layers, the recesses 20 and 21 do not penetrate through the graphene layer 1 if the recesses 20 and 21 are holes which penetrate through only one of the layers. In addition, the recesses 20 and 21 penetrate through the graphene layer 1 if the recesses 20 and 21 are holes which penetrate through all the plurality of layers.

As described, in a case where a periodic structure is formed on the graphene layer 1, electromagnetic waves with a specific wavelength corresponding to the periodic structure can be absorbed similarly to the above case where the periodic structure is formed on the electrodes 2. Since graphene is semimetal, the principle is based on plasmon resonance similar to that of metal.

Two-dimensional periodic arrangement may be any periodic array such as a square lattice or a triangular lattice. In addition, the recess 20 may have any shape such as a column, a prism, a triangular prism, a quadrangular prism, or an elliptic cylinder. However, in a case where the shape viewed from top is asymmetric, such as in a case of a triangular prism, since light absorbed by the graphene layer 1 is polarization-dependent, it is possible to configure an electromagnetic wave detector which detects only specific polarized light.

One-dimensional periodic arrangement may be one-dimensional grooves arranged side by side as shown in FIG. 14, for example.

By forming such a periodic structure on the graphene layer 1, only electromagnetic waves with a specific resonance wavelength can be absorbed on the surface of the graphene layer 1. That is, the electromagnetic wave detector can intensively detect only electromagnetic waves with a specific resonance wavelength, and detection sensitivity for a specific wavelength can be enhanced.

Here, a case where the periodic recesses 20 or 21 are formed on the surface of the graphene layer 1 has been described. However, a pattern in which periodic projections are formed may be adopted.

Seventh Embodiment

An electromagnetic wave detector (not shown) according to a seventh embodiment differs from the electromagnetic wave detector 100 according to the first embodiment in that a 2D material such as transition metal dichalcogenide or black phosphorus is used in lieu of the graphene layer 1. The structure other than that is similar to the structure of the electromagnetic wave detector 100. Transition metal dichalcogenide, black phosphorus, and the like are called 2D materials because each of them has an atomic layer structure similar to that of graphene. Examples of the 2D materials include transition metal dichalcogenide such as $MoS_2$, $WS_2$, or $WSe_2$, and black phosphorus. In addition, a structure may be adopted where materials of the same kind or materials of different kinds from among the above materials are laminated. Alternatively, dissimilar materials such as perovskite and graphene or a 2D material may be joined to each other.

The above 2D material such as transition metal dichalcogenide or black phosphorus has a predetermined band gap. Therefore, since off-current becomes nearly zero, noise of the electromagnetic wave detector becomes small, and performance of the electromagnetic wave detector can be improved.

In addition, since the band gap can be adjusted by changing the number of laminated layers of the 2D material such as transition metal dichalcogenide or black phosphorus, the wavelength of the electromagnetic wave to be detected can be selected by changing the number of layers. Thus, a wavelength selection type electromagnetic wave detector which detects only electromagnetic waves with a specific wavelength can be obtained. Unlike a conventional semiconductor detector, since it is not necessary to control the band gap by changing the composition of a semiconductor material, the electromagnetic wave detector can be easily manufactured. In addition, since it is not necessary to use an optical filter, which is used for a typical wavelength selection method, the number of optical components can be reduced, and loss of incident light caused due to passage of the incident light through the filter can also be reduced.

In addition, in a case where the 2D material such as transition metal dichalcogenide or black phosphorus is used, polarization dependency can be obtained by adopting a laminated structure including a plurality of layers. Therefore, an electromagnetic wave detector which selectively detects only specific polarized light can be realized.

Furthermore, by forming a heterojunction by combining at least two different kinds of materials from among the 2D materials such as transition metal dichalcogenide and black phosphorus, or by combining the 2D material such as transition metal dichalcogenide or black phosphorus and graphene, effects identical to effects of a quantum well structure and a tunneling current in a conventional semiconductor material can be obtained between dissimilar materials. Therefore, since noise can be reduced and the occurrence of recombination can be reduced, sensitivity of the electromagnetic wave detector can be improved.

Eighth Embodiment

Figure 15:
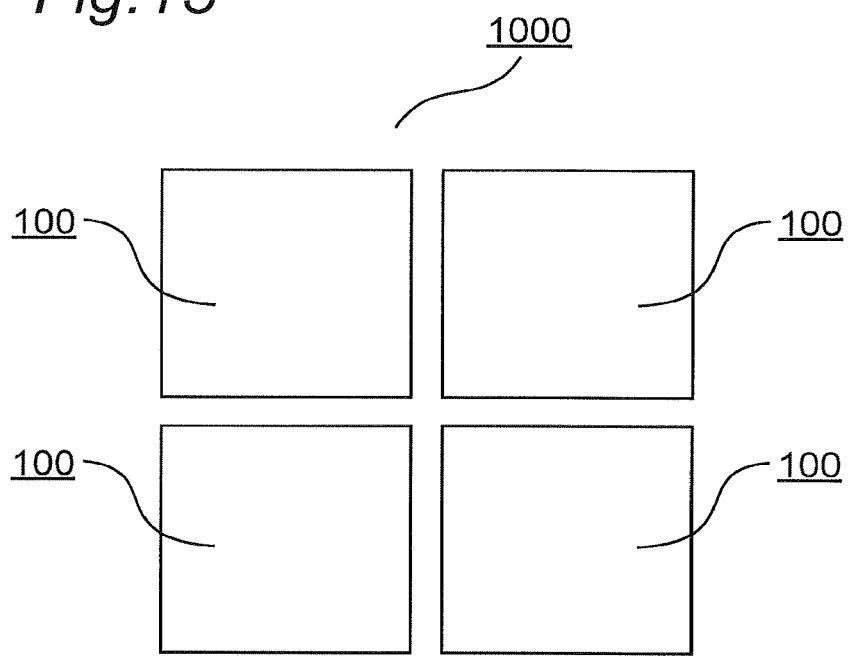
FIG. 15 is a top view of an electromagnetic wave detector array according to an eighth embodiment of the present invention.

FIG. 15 is a top view of an electromagnetic wave detector array according to an eighth embodiment of the present invention, the entirety of which is denoted by 1000. In FIG. 15, the electromagnetic wave detectors 100 according to the first embodiment are arranged in two rows and two columns. However, the number of arranged electromagnetic wave detectors is not limited to this.

In the electromagnetic wave detector array 1000, the electromagnetic wave detectors according to any one of embodiments 2 to 7, other than the electromagnetic wave detectors 100, may be arranged in an array.

As described, the electromagnetic wave detector array including graphene can detect electromagnetic waves in an extremely wide wavelength range from an ultraviolet light to a microwave. Therefore, for example, in a case where the electromagnetic wave detector array is applied to an on-vehicle sensor, the electromagnetic wave detector array can be used as a visible-light image camera in the daytime and can be used as an infrared camera at night. Thus, it is not necessary to use different cameras depending on the detection wavelength.

Note that a circuit for reading an electrical signal obtained from each electromagnetic wave detector 100, a circuit for selecting a row and a column, and the like are preferably provided outside the electromagnetic wave detector array 1000.

Ninth Embodiment

Figure 16:
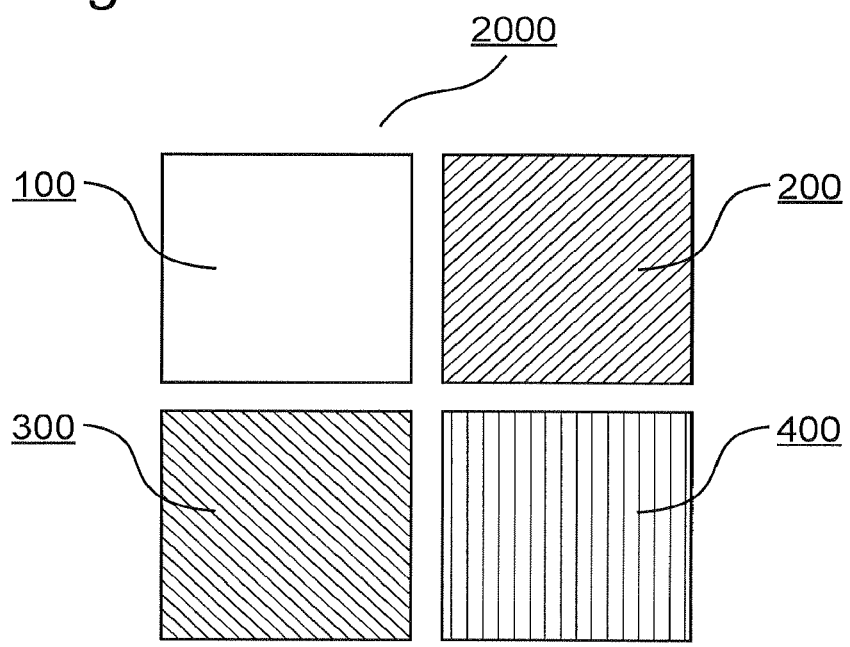
FIG. 16 is a top view of an electromagnetic wave detector array according to a ninth embodiment of the present invention.

FIG. 16 is a top view of an electromagnetic wave detector array according to a ninth embodiment of the present invention, the entirety of which is denoted by 2000. In FIG. 16, the electromagnetic wave detectors 100, 200, 300 and 400, which differ from one another in kind, are arranged in two rows and two columns. However, the number of arranged electromagnetic wave detectors is not limited to this.

In the electromagnetic wave detector array 2000 according to the ninth embodiment, different kinds of electromagnetic wave detectors described in the first to eighth embodiments are arranged in a one-dimensional or two-dimensional array. Thus, the electromagnetic wave detector array 2000 can have the function as an image sensor.

For example, in the electromagnetic wave detector array 2000 shown in FIG. 16, the electromagnetic wave detectors 100, 200, 300, and 400 are made of electromagnetic wave detectors with different detection wavelengths. Specifically, the electromagnetic wave detectors having the ability to select a detection wavelength, described in the fifth to seventh embodiments are arranged in an array. Thus, the electromagnetic wave detector array 2000 can detect electromagnetic waves with at least two different wavelengths.

As described, by arranging electromagnetic wave detectors with different detection wavelengths in an array, it is possible to obtain a colored image in wavelength ranges of an ultraviolet light, an infrared light, a terahertz wave, and a radio wave in the same manner as in an image sensor used in a visible light range.

In addition to usage other than as an image sensor, the electromagnetic wave detector array 2000 can be used as a position detection sensor for an object even with a small number of pixels. Due to the structure of the electromagnetic wave detector array 2000, an image sensor which detects optical intensity of electromagnetic waves with a plurality of wavelengths can be manufactured. Thus, a colored image can be obtained by detecting electromagnetic waves with a plurality of wavelengths without using a color filter, which is required in a conventional CMOS sensor or the like.

Furthermore, by arranging electromagnetic wave detectors which detect different polarized lights in an array, a polarized-light discrimination image sensor can be configured, and an artificial object and a natural object can be discriminated, for example.

DESCRIPTION OF REFERENCE SYMBOLS

1 GRAPHENE
2 ELECTRODE
3 INSULATING LAYER
4 SUBSTRATE
5 BUFFER LAYER
6, 7 ELECTRODE
8, 9 BUFFER LAYER
10, 11 RECESS
12 GRAPHEME LAYER
13 PROTECTIVE FILM
14 ELECTRODE
100, 110, 120, 130 ELECTROMAGNETIC WAVE DETECTOR
1000, 2000 ELECTROMAGNETIC WAVE DETECTOR ARRAY

The invention claimed is:

1. An electromagnetic wave detector, comprising:
a conductive substrate;
an insulating layer provided on the substrate;
a graphene layer provided on the insulating layer;
a pair of electrodes provided on the insulating layer, with the graphene layer interposed between the pair of electrodes; and
buffer layers interposed between the graphene layer and each of the electrodes respectively and separating the graphene layer and the electrodes from each other, so that movement of electric charges between the graphene layer and the electrodes is hindered.

2. The electromagnetic wave detector according to claim 1, wherein each electrode of the pair of electrodes is made of the same material.

3. The electromagnetic wave detector according to claim 1, wherein each electrode of the pair of electrodes is made of a material different from the other electrode of the pair of electrodes.

4. The electromagnetic wave detector according to claim 1, wherein a Dirac point (DPe), which is different from a Dirac point in the graphene layer, is formed between the graphene layer and one electrode of the pair of electrodes.

5. The electromagnetic wave detector according to claim 1, wherein each electrode of the pair of electrodes is made of metal and each buffer layer of the buffer layers is made of an oxide of the metal.

6. The electromagnetic wave detector according to claim 1, wherein a protective film is provided so as to cover the graphene layer and the buffer layers.

7. The electromagnetic wave detector according to claim 1, wherein in the pair of electrodes, a size of an area where each electrode of the pair of electrodes faces the graphene layer across each of the buffer layers differs between the pair of electrodes.

8. The electromagnetic wave detector according to claim 1, wherein each of the buffer layers, which are provided between the pair of electrodes and the graphene layer, is made of a material different from the other.

9. The electromagnetic wave detector according to claim 1, wherein one of periodic recesses and periodic projections, which cause surface plasmon resonance, are formed on surfaces of the electrodes.

10. The electromagnetic wave detector according to claim 1, wherein one of periodic recesses and periodic projections which cause surface plasmon resonance are formed on a surface of the graphene layer.

11. The electromagnetic wave detector according to claim 9, wherein the periodic recesses include one of periodic holes, which are arranged one-dimensionally or two-dimensionally, and one-dimensional grooves which are arranged side by side.

12. The electromagnetic wave detector according to claim 1, wherein the graphene layer includes one of a lamination structure of at least two graphene layers, a two-dimensional material, a lamination structure of two-dimensional materials, and a lamination structure of graphene and a two-dimensional material.

13. An electromagnetic wave detector array, comprising:
a plurality of electromagnetic wave detectors according to claim 1, wherein
the plurality of electromagnetic wave detectors are arranged in an array.

14. An electromagnetic wave detector array, comprising:
a plurality of electromagnetic wave detectors according to claim 9, wherein
each electromagnetic wave detector of the plurality of the electromagnetic wave detectors differs from one another, and
the plurality of electromagnetic wave detectors are arranged in an array.

15. An electromagnetic wave detector array, comprising:
a plurality of electromagnetic wave detectors according to claim 12, wherein
each electromagnetic wave detector of the plurality of the electromagnetic wave detectors differs from one another, and
the plurality of electromagnetic wave detectors are arranged in an array.

16. The electromagnetic wave detector according to claim 1, wherein at least one buffer layer of the buffer layers is made of an insulating material.

17. The electromagnetic wave detector according to claim 1, wherein at least one buffer layer of the buffer layers comprises a material selected from the group consisting of an active metal, an alkali metal and an alkali earth metal.

18. The electromagnetic wave detector according to claim 1, wherein at least one buffer layer of the buffer layers is made of a transition metal oxide or organic matter.

19. The electromagnetic wave detector according to claim 1, wherein at least one buffer layer of the buffer layers is made of a mixed film of any one of an active metal, an alkali metal, an alkali earth metal or a transition metal and organic matter.

20. An electromagnetic wave detector, comprising:
a conductive substrate;
an insulating layer provided on the substrate;
a graphene layer provided on the insulating layer;
a pair of electrodes provided on the insulating layer, with the graphene layer interposed between the pair of electrodes; and
buffer layers interposed between the graphene layer and each of the electrodes respectively and separating the graphene layer and the electrodes from each other, wherein
a Dirac point (DPe), which is different from a Dirac point in the graphene layer, is formed between the graphene layer and one electrode of the pair of electrodes.

21. An electromagnetic wave detector, comprising:
a conductive substrate;
an insulating layer provided on the substrate;
a graphene layer provided on the insulating layer;
a pair of electrodes provided on the insulating layer, with the graphene layer interposed between the pair of electrodes; and
buffer layers interposed between the graphene layer and each of the electrodes respectively and separating the graphene layer and the electrodes from each other, wherein
each electrode of the pair of electrodes is made of metal and each buffer layer of the buffer layers is made of an oxide of the metal.

* * * * *